United States Patent [19]
Wells

[11] Patent Number: 5,341,339
[45] Date of Patent: Aug. 23, 1994

[54] METHOD FOR WEAR LEVELING IN A FLASH EEPROM MEMORY

[75] Inventor: Steven E. Wells, Citrus Heights, Calif.

[73] Assignee: Intel Corporation, Santa Clara, Calif.

[21] Appl. No.: 145,654

[22] Filed: Nov. 1, 1993

Related U.S. Application Data

[63] Continuation of Ser. No. 969,467, Oct. 30, 1992, abandoned.

[51] Int. Cl.$^5$ .............................................. G11C 13/00
[52] U.S. Cl. ................................... 365/218; 365/185; 365/900
[58] Field of Search ............. 365/200, 189.01, 230.01, 365/149, 900, 185, 218

[56] References Cited

U.S. PATENT DOCUMENTS

| | | |
|---|---|---|
| 4,642,759 | 2/1987 | Foster . |
| 4,644,494 | 2/1987 | Muller . |
| 4,757,533 | 7/1988 | Allen et al. . |
| 4,763,305 | 8/1988 | Kuo . |
| 4,802,117 | 1/1989 | Chrosny et al. . |
| 4,896,262 | 1/1990 | Wayama et al. . |
| 4,958,315 | 9/1990 | Balch . |
| 5,047,989 | 9/1991 | Canepa et al. . |
| 5,070,474 | 12/1991 | Tuma et al. . |
| 5,077,737 | 12/1991 | Leger et al. . |
| 5,111,385 | 5/1992 | Hattori . |
| 5,131,089 | 7/1992 | Cole . |
| 5,224,070 | 6/1993 | Fandrich et al. .................. 365/900 |

FOREIGN PATENT DOCUMENTS

| | | | |
|---|---|---|---|
| 2088442 | 7/1993 | Canada ................................... | 13/16 |
| 0392895 | 10/1990 | European Pat. Off. ................. | 16/6 |
| 2251323 | 1/1992 | United Kingdom ..................... | 12/2 |
| 2251324 | 1/1992 | United Kingdom ..................... | 12/2 |

OTHER PUBLICATIONS

Solid-State Mass Storage Arrives, Product Feature, Memory Card Systems & Design, Jul./Aug. 1992.
Optimal Solid State Disk Architecture for Portable Computers, Dan Auclair Proceedings of Silicon Valley P.C. Design Conference, Jul. 9, 1991.

*Primary Examiner*—Terrell W. Fears
*Attorney, Agent, or Firm*—Blakely, Sokoloff, Taylor & Zafman

[57] ABSTRACT

In a process for cleaning up a flash EEPROM memory array separated into blocks which may be separately erased, in which process all valid data is first written to other blocks of the array, and then the block is erased, the improvement including the step of determining a block to clean up based on a comparison of the number of invalid sectors each block includes and the number of switching operations which each block has undergone.

8 Claims, 4 Drawing Sheets

FIG._3

FIG_4

METHOD FOR WEAR LEVELING IN A FLASH EEPROM MEMORY

This is a continuation of application Ser. No. 07/969,467, filed Oct. 30, 1992 abandoned.

BACKGROUND OF THE INVENTION

1. Field of the Invention

This invention relates to computer memory arrangements and, more particularly, to methods for equalizing the amount of switching accomplished in different parts of a flash electrically erasable programmable read only memory (flash EEPROM) array.

2. History of the Prior Art

Modern computer systems make extensive use of long term memory. Typically this memory is provided by one or more hard (fixed) disks. A hard disk is an electro-mechanical device which includes one or more flat circular disks fixed to rotate rapidly about a central axis. Each flat disk has opposite surfaces which are coated with some form of magnetic material. A mechanical arm driven by electrical signals places a magnetic head over each side of each disk to write to positions on the disk or to read from those positions. These positions lie in sectors, a number of which (e.g., seventeen) form one complete track on one side of a disk. Each sector is capable of storing a fixed number of bytes of data (typically 512 bytes). Depending on formatting, a single side of a disk may have over six hundred tracks. A typical disk drive used in personal computers today is capable of storing forty megabytes of data.

Such hard disk drives are very useful and have become almost a necessity to the operation of personal computers. However, such electro-mechanical drives do have their drawbacks. They are relatively heavy and increase the weight of a computer, especially a portable computer, significantly. They also are relatively bulky and require a significant amount of space within a computer. Their use requires a significant amount of the power and in a portable computer leads to significant battery power consumption. More importantly, electromechanical hard disk drives are very susceptible to shock. A hard drive within a portable computer which is dropped is quite likely to cease functioning. This can cause a catastrophic loss of data.

Recently, forms of long term storage other than electromechanical hard disks have become feasible for use in computers. One of these is flash EEPROM. Flash EEPROM memory is comprised of a large plurality of floating-gate field effect transistors arranged as memory cells in typical row and column fashion with circuitry for accessing individual cells and placing the memory transistors of those cells in one of two memory conditions. A flash memory cell, like a typical EPROM cell but in contrast to DRAM memory, retains information when power is removed. Flash EEPROM memory has a number of characteristics which adapt it to use as long term memory. It is light in weight, occupies very little space, and consumes less power than electromechanical disk drives. More importantly, it is especially rugged. It will withstand without adverse effects repeated drops each of which would destroy a typical electromechanical hard disk drive.

A difficulty with flash EEPROM, however, is that it is not reprogrammable until it has been erased. Flash EEPROM is erased by applying a high voltage simultaneously to the source terminals of all of the transistors (cells) used in the memory. Because these source terminals are all connected to one another by metallic busing in the array, the entire array must be erased at once. While an electromechanical hard disk will typically store information in a first area of the disk and then rewrite that same area of the disk when the information changes, this is not possible with a flash memory array without erasing all of the valid information that remains in the array along with the invalid (dirty) information. If all of the information is erased each time a single entry has to be rewritten, then all of the valid information which was erased must also be rewritten with each update. As may be appreciated, such a process used to update entries as the data changes would significantly slow the operation of any computer system using flash memory in place of an electro-mechanical hard disk. Moreover, partly because of the need to rewrite valid information, the erase process for flash EEPROM is quite slow; it typically requires between one and two seconds. Such an erase time would seem to preclude the use of flash EEPROM for rapidly changing data.

Thus, when a flash EEPROM array is to be used for long term storage where data is rapidly changing as is the case with the information typically stored by an electro-mechanical hard disk, some method of erasing and rewriting the flash array must be devised which is different than that typically used for electro-mechanical hard disks and does not slow the operation of the system.

It has been found possible to reduce the amount of flash memory which must be erased at once by physically separating the flash array during chip layout into groups (blocks) of cells which may be erased together. This type of arrangement reduces the reprogramming effort to some extent but it may be used only in a limited manner because the individual blocks of cells must be physically isolated on the silicon in order to allow the blocks to be flash erased separately. The physical isolation required increases the necessary area to hold such blocks of flash memory.

For example, a new arrangement using such a division of flash memory into isolated blocks is disclosed is U.S. patent application Ser. No 969,131, entitled *Method and Circuitry for a Solid State Memory Disk*, S. Wells, filed on even date herewith, and assigned to the assignee of the present invention. In that arrangement, a typical long term storage array is comprised of flash memory arranged in a series of blocks. In one embodiment, the array is divided into a number of silicon chips each of which is subdivided into sixteen subblocks. Each subblock is, in fact, physically paired with a subblock on another of the silicon chips to create a logical block of the array in which odd bytes of data are stored on the subblock of one chip and even bytes of data are stored on the subblock of the other chip. Each of the logical blocks of flash memory is separately erasable from all other such blocks. However, each of the logical blocks of the array typically holds 128 kilobytes of data, sufficient to hold 256 sectors of information normally stored on the tracks of an electromechanical hard disk drive. Thus, a thirty chip flash array with sixteen individually-erasable subblocks per chip holds about the same amount of data as does a thirty megabyte electro-mechanical hard disk. Even with this division of data into 240 individually-erasable parts (logical blocks), erasure of a block effects erasure of such a very large amount of information that to attempt to erase all of the data and then replace the valid data with each rewrite of a sector would not be feasible.

In order to overcome this problem, data is written to any block of the flash memory array which has space available. Thus, data is written to an empty position in the array no matter what the sector address of the data or the physical address on the block. A piece of data to be written to a sector five, for example, is written to the next available space on a block being written no matter where that may be; and a lookup table is kept which records the physical position on the block of the logical address (sector five). This arrangement of the array allows a first block to be written sector by sector, a second block to be written in the same sequential manner, and so on. When the data in a sector changes so that the sector needs to be rewritten, the data is written to a new physical position, the data in the lookup table is changed to record the new physical position against the logical sector number, and the first position at which the data was written is marked as dirty so that an attempt to read that physical position produces an error signal. After some period of time, a sufficient number of blocks will be filled that it will be desirable to release space by moving the valid information from some especially dirty block to some other block and erasing the entire block from which the valid information has been read. This is referred to as "cleaning up a block" and has the effect of freeing up an additional number of sectors equal to all of the sectors on the erased block which have previously been marked as dirty.

An especial advantage of the arrangement is that it allows the erasure of blocks to occur in the background. That is, since invalid individual entries are not erased as they are rewritten, erasure may be arranged to occur when the facilities of the array are not otherwise occupied with reading and writing. In this manner, the external host which is writing to and receiving information from the flash array is typically not aware that an erasure is taking place even though the erasure requires one or two seconds.

Another advantage of the arrangement is that the individual blocks of flash memory store sectors of data in physical areas which may be of any size rather than the fixed size sectors stored by electro-mechanical hard disks. This essentially eliminates the lost space typical of hard and floppy disks with their fixed size sectors because each individual sector of data placed on a block of flash memory need only be as long as the space required to store the data. Thus, sectors may be placed on a block of flash memory essentially abutted against a last valid byte of data from the last sector stored with a space left blank between sectors which averages only one byte of data. When data is compressed, it may take substantially less space than that required for storing the uncompressed data of a 512 byte sector. The space normally left at the end of a sector of fixed physical size may be eliminated when data is compressed. This elimination of waste storage space along with other attributes of the arrangement allows flash memory storing data at a compression rate of 1.5 to store the same amount of data in approximately three quarters as much physical storage space as is stored by a typical electromechanical hard disk of a given size.

A problem exhibited by flash memory is that it tends to have a limited life in use. This would seem to be due to the floating-gate transistors of the array requiring longer to switch after undergoing some number of switching operations. This number is quite large; it has been estimated that although switching begins to take longer after approximately ten thousand switching operation, approximately one hundred thousand switching operations are required before the extended switching time has any affect on system operation. Even so, the typical processes used to select the cells in which data is to be stored tend to cause certain transistors on a block and certain blocks of transistors to switch more often than do other transistors. Studies indicate that certain areas of a flash memory array such as those blocks in which application programs are stored are subject to very infrequent rewriting. On the other hand, blocks where data is accumulated for a particular operation by an application program change and must be rewritten very frequently. Moreover, since the blocks which store rapidly changing data have more dirty sectors than do other blocks, those blocks will be cleaned up more often. Once a block has been cleaned up during operation, it is much more likely to receive rapidly changing data than it is to receive data which does not change. Consequently, a block containing data initially subject to rapid change will automatically be subject to additional rapid change due to the nature of the data architecture. Changing data necessitates the cleanup of such blocks. Consequently, a particular block may be subject to much more rapid failure than other blocks if something is not done to equalize the amount of switching over the entire array.

An arrangement for controlling the number of switching cycles to which each block of a flash memory is subject is very desirable. Such an arrangement would go far toward correcting the statistical vagaries which might otherwise induce certain portions of a flash memory array to experience early failure.

SUMMARY OF THE INVENTION

It is, therefore, an object of the present invention to provide a method for extending significantly the life of a flash memory array.

It is another more specific object of the present invention to provide a method for equalizing the switching of different portions of a flash memory array.

These and other objects of the present invention are realized in a process for cleaning up a flash EEPROM memory array separated into blocks which may be separately erased, in which process all valid data on a selected block is first written to other blocks of the array, and then the block is erased, the improvement comprising the step of determining a selected block to clean up based on a comparison of the number of invalid sectors each block includes and the number of switching operations which each block has undergone.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer or a portion thereof and the method of computation itself should be borne in mind. The present invention relates to apparatus and to method steps for operating a computer in processing electrical or other (e.g. mechanical, chemical) physical signals to generate other desired physical signals.

DETAILED DESCRIPTION

Figure 1:
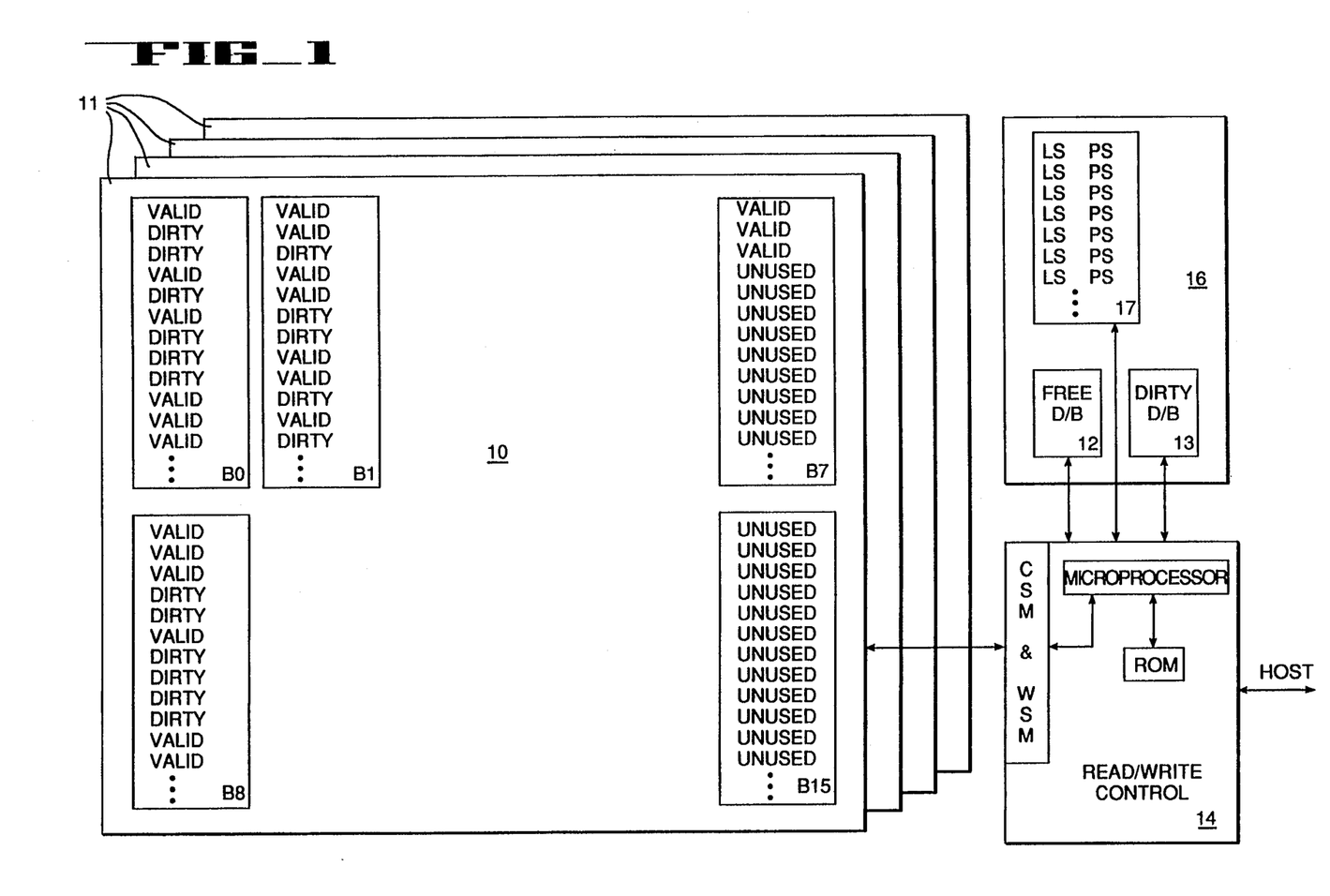
FIG. 1 is a block diagram illustrating the layout of a flash memory array in which the present invention may be utilized.

Referring now to FIG. 1, there is illustrated in block diagram form a flash EEPROM memory array 10 in which the present invention may be practiced. The array 10 includes a plurality of blocks B0-B15 of flash EEPROM memory. Each block includes floating-gate field effect transistor memory cells (not shown) arranged in typical row and column fashion and having circuitry arranged for selecting any particular block of memory and any particular row and column of that block so that the memory cell at that position may be written or read. The details of the layout of transistor memory arrays and the associated accessing circuitry are well known to those skilled in the art and are, therefore, not shown here.

As has been well described in many publications, flash memory is essentially an EPROM array with facilities provided so that entire array may be erased by a high voltage value applied simultaneously to the source terminals of all the memory transistors of the array. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage (typically twelve volts) required for erasure. Since all source terminals of the memory transistors in a block are joined together, a cell in a zero state remains in that state until the entire block of the array is erased once again.

In the array 10 illustrated in FIG. 1, blocks B0-B15 of memory are illustrated positioned on a first chip 11 of the array 10. Additional (e.g., thirty) silicon chips 11 each hold additional blocks of the array 10 to provide a total of 240 blocks in one embodiment. In such an embodiment, as was explained above, any block is actually constructed of a pair of subblocks which may be positioned on adjacent chips. The subblocks have input, output, and selection conductors such that odd bytes of data are stored in one subblock and even bytes of data on the other subblock. From this point on in this description, a block may be considered to include such a pair of subblocks.

When a host begins writing data to be stored in the array (such as an application program) to some block of the array which has been completely erased, the data to be stored is written sequentially, sector by sector, to that block until that block has been filled with data. Then writing proceeds to the next sequential block having free space. At any point after writing is completed, the information may be read back from the array 10 by interrogating the block and sector at which the data is stored.

In accordance with the arrangement described above, the data is stored in sectors which are similar to the physical sectors utilized in storing data on the typical electromechanical hard disks of the prior art except that the sectors may be of any size (as will be explained below). When the information already written to a sector of the array is changed so the data stored for the sector must be changed, the new information is written to a new sector located on some one of the blocks of the array 10 having free space, and the old sector is marked invalid (dirty). This, rather than writing over the old information, occurs because the old information can only be rewritten if the entire block on which it is stored is erased. To erase an entire block without destroying valid data would entail copying all of the valid data to another block of the array 10, erasing the original block, rewriting the valid data back into the original block, then writing the new data into the original block where the dirty data had been written. It will be understood that this is a very time consuming operation and using such a process in order to rewrite individual entries would slow to a standstill the operation of any computer. Consequently, it is not practiced. Instead the new information is written to a new position on a possibly different unfilled block (e.g., block B7), and the old position is marked dirty by writing zeroes as an invalid indication along with the sector number of the entry. It will be recognized that a value of zero may be written to any memory cell without erasing the block of the array.

Because of this arrangement by which data is replaced, the sector number which is used to indicate where data is stored is a logical sector number rather than a physical sector number. This should be contrasted with the physical sector number used to arrange data on the typical electromechanical hard disk. In order to allow the use of logical sector numbers, a lookup table 17 listing logical sector numbers against physical sector numbers is stored in a random access memory 16 utilized with the array 10. The table 17 is used to determine the physical position in the array 10 at which any particular logical sector exists. Also, because of this arrangement by which data is replaced, each block of the array will after some time have a number of entries which are marked dirty and cannot be used for storage. Consequently, as the array 10 fills with data, a point will come when it is necessary to clear out dirty information from a block in order to provide space for new information to be stored. In one embodiment of the invention, this occurs when the total amount of space which is dirty is eighty percent of the total of all dirty space plus free space. Typically, the dirtiest block of the array 10 is chosen for erasure. This allows the smallest amount of valid data to be moved from the block being erased to another block of the array. Once the valid information is written to another block and the new addresses are recorded in the lookup table 17, the block from which the information was read is erased. It is then placed back in operation as an entirely clean block. In order to allow this cleanup operation to occur, some number of blocks must be kept in reserve to be used when cleanup is necessary. In an arrangement in which the present invention is utilized, fourteen blocks of the 240 blocks available are used to provide sufficient space for both continuing write operations and for cleanup operations.

Figure 2:
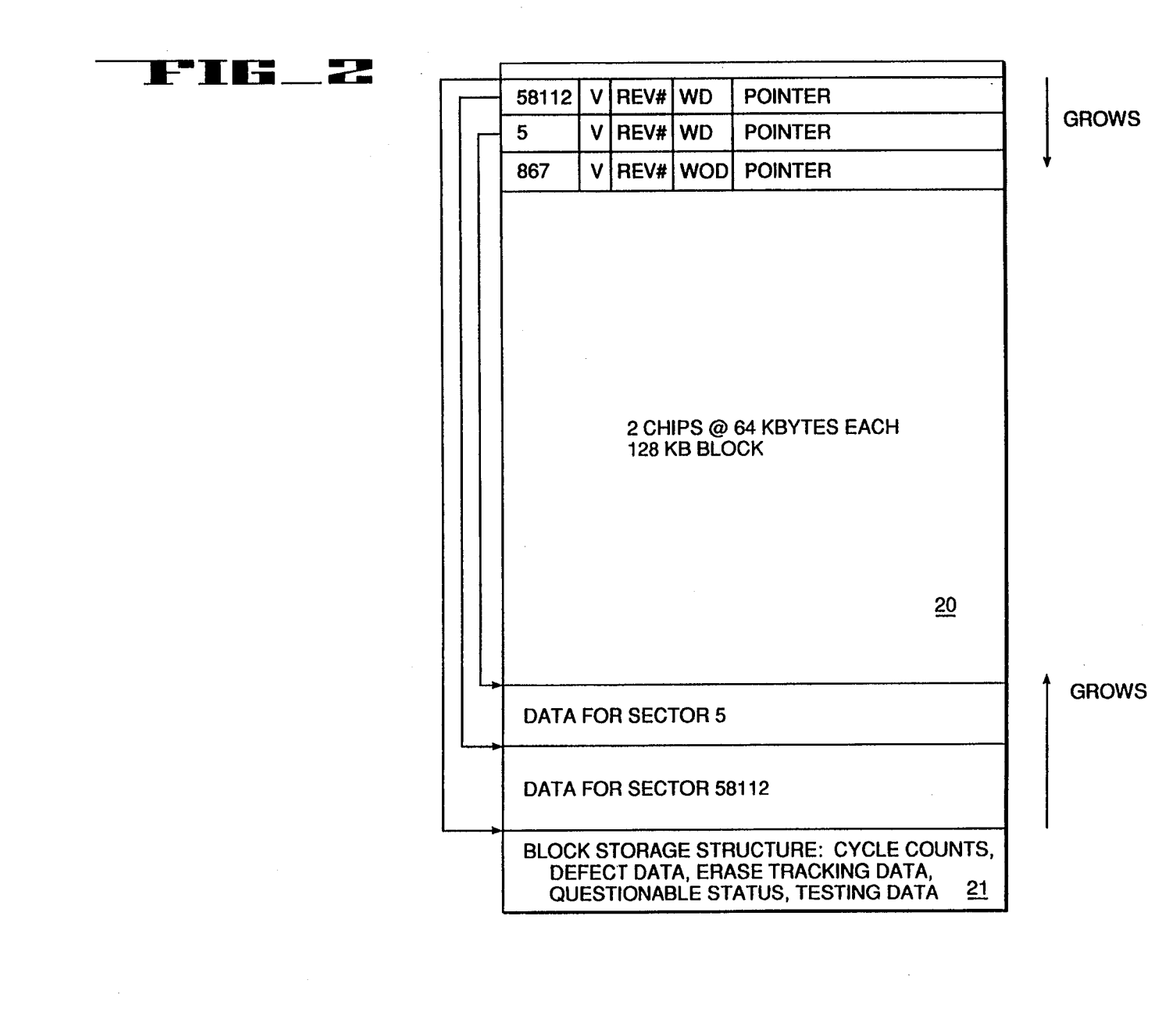
FIG. 2 is a block diagram illustrating the pattern of storage of information on a single block of a flash memory array such as that illustrated in FIG. 1.

FIG. 2 illustrates one logical arrangement used for an individual block in order to obtain the advantages discussed above. FIG. 2 is an idealized drawing useful in understanding the way data is stored on each block of the array 10. FIG. 2 illustrates a typical block 20 as a rectangle. The rectangular area includes a plurality of transistor devices arranged to provide the 128 K bytes of storage which each block provides. As mentioned previously, the area of an individual block is actually split between subblocks on two physical chips, one of which holds odd numbered bytes of data and one of which holds even numbered bytes of data. The individual transistor memory devices and the various column and row select lines and other conductors for operating the block are not illustrated but are well known to those skilled in the art of designing flash memory.

As may be seen in FIG. 2, data is stored in the block 20 beginning at the top of the block and at the bottom (a small area 21 at the very bottom on the block is reserved for block structure data). At the top of the block 20 are stored in identification fields called sector translation tables (headers) the logical sector numbers used by the operating system as addresses for the data. For example, a first sector number 58112 is stored in the header for the first entry at the top. Following the sector number are stored various attribute bits and a pointer value. The attributes included in one embodiment are an indication of the validity of the entry, a revision number, an indication whether the data is compressed or not, and a bit which indicates whether the entry includes data. The indication of the validity of the entry is at least one bit which signifies valid when it is a one value and invalid when it is a zero value; this bit may be duplicated to better assure the correct validity is stored. The revision number is, in one embodiment, a four bit number. The bit which indicates whether the entry includes data or not is utilized to allow sectors to be created without data.

The pointer value (an offset into the block) points to a physical address in the data area of the block 20 at which the data for logical sector 58112 is stored. An arrow in FIG. 2 illustrates this physical position at which the first bits of data for the logical sector 58112 are stored. Since the amount of data to be stored is known at the time of a write operation, in one embodiment of the block 20, the data is stored by writing down to the next previously stored data. In the case of logical sector 58112 which is the first sector on the block 20, the data is written from the beginning of the address stored as a pointer with the sector number 58112 to the beginning (at the bottom) of the data area. This position at which the data begins at the bottom is marked by a beginning pointer value stored before the first header entry at the top of the block. These two positions on the block are shown connected by an arrow extending from the upper left hand corner to the lower left hand corner of the block 20.

The amount of data written to the logical sector 58112 is not fixed and may vary. However, in the typical interface between the computer system and the storage system, data is assigned to storage in sectors of 512 bytes. FIG. 2 shows a second logical sector 5 and its pointer directed to a physical position on the block 20 which stores the first bit of the data for sector 5. The data for sector 5 is stored in a data area which begins just above the most recent data sector written (sector 58112) and extends downward so that the last row of the data for the new sector lies in the row just above the first row of data for sector 58112. Since the data for each new sector is written in all of the rows immediately above the data for the last-written sector, only a trivial amount of data space (averaging one byte) is wasted in the block storage scheme of the arrangement. When the data being sent to storage is compressed, the amount of storage space normally left empty in a fixed size storage arrangement may be eliminated. This should be contrasted with the very large amount of unused space typical to an apparently full electromechanical hard disk using fixed sector sizes.

As was pointed out above, the physical position of the sector number is stored in the lookup table 17 (which is preferably held in static random access memory on the circuit board which holds the other components of the array 10) with the chip number, the block, and other information (such as row and column addresses) for retrieving the data. The data stored in any sector of the block 20 may be retrieved by determining the physical address of the sector number from the lookup table 17, using that address to go to the physical position on the block 20 where the sector number is stored, and retrieving the pointer to the beginning position of the data and the pointer to the beginning position of the sector whose number is stored immediately above the sector number being retrieved. These two values determine the starting and ending positions for the sector the data of which is sought.

The unusual arrangement for rewriting data used by a flash memory array requires that the memory allocation system continually make new or newly-erased memory available for data to be written and rewritten. As was pointed out above, this requires that some number of blocks always be available in order to allow blocks holding invalid data to be cleaned up and their dirty sectors released.

Figure 4:
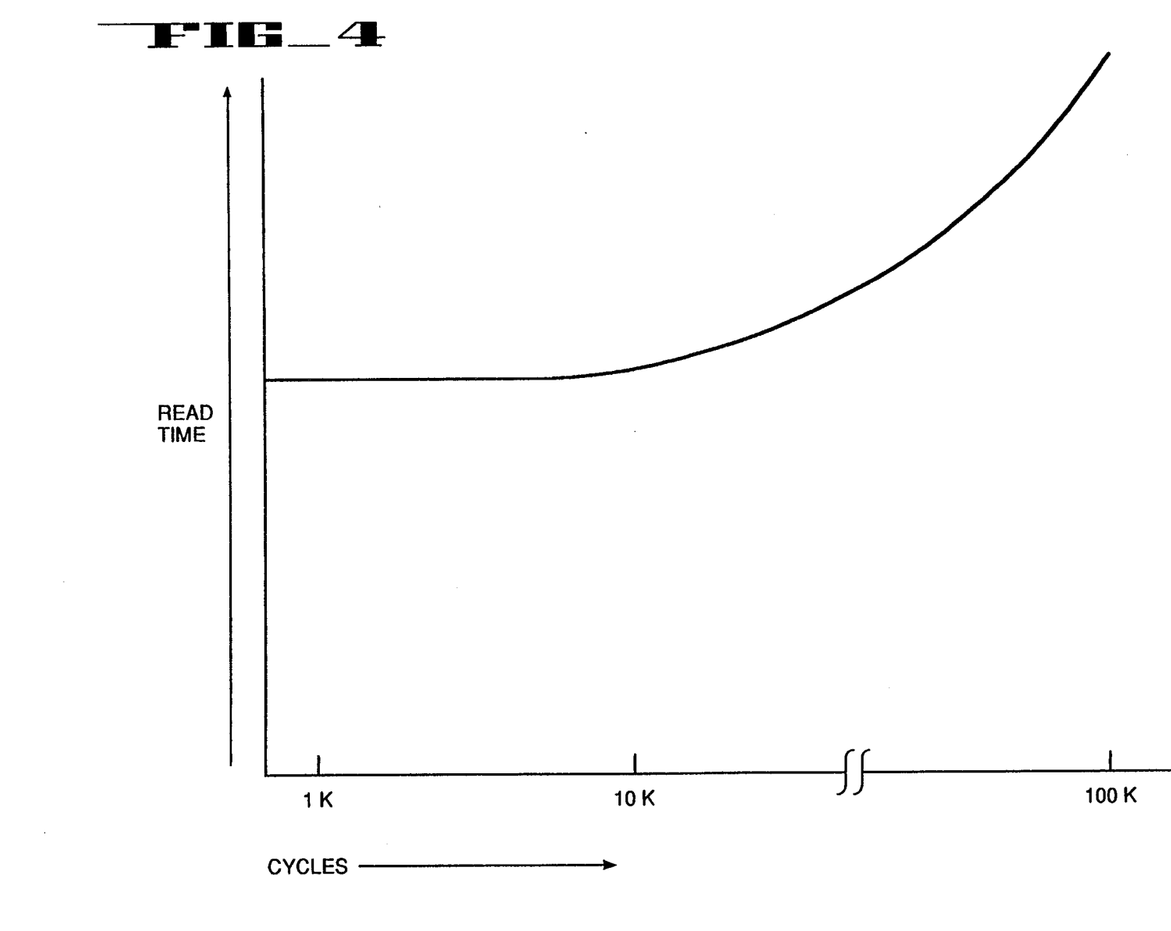
FIG. 4 is a graph illustrating wear characteristics of flash memory arrays.

A problem which occurs in the operation of any memory array is that attempts to read, write, and erase that memory sometimes fail. One very significant problem with flash memory is that after an extended period of use, the memory transistors appear to lose their ability to switch within a prescribed period of time. It has been found that this wearing out is really a lengthening of the time required for a signal read from a memory cell to settle to its final value. The data is correctly stored and may be read out of the cell, but the time required has lengthened so that it is no longer within the prescribed limits of the circuitry. Once flash memory begins to exhibit this characteristic, the time for settling continues to lengthen so that, ultimately, the memory is outside the useful range. FIG. 4 illustrates the typical use characteristics of a flash memory array measured by the number of switching operations accomplished versus the settling time of the output signal. As may be seen, after approximately ten thousand switching operations, the settling time for a block of flash memory begins to lengthen. This ten thousand switching operations has therefore been selected as a typical life for such an array.

As was pointed out above, if a strategy is implemented by which a dirtiest block is cleaned up whenever it is necessary to release storage space used by dirty sectors of the array, it is probable that certain blocks will receive much more use than will other blocks of the array. This occurs because certain blocks initially receive data which is subject to more rapid change than is data stored in other blocks. For example, application programs typically do not change during use while data used by those programs does change frequently. The blocks which receive rapidly changing data will be cleaned up sooner than other blocks of the array. Once cleaned up, these blocks will probably receive additional rapidly changing data because, once the application programs containing static data have been stored, this rapidly-changing data is the type usually written to long term storage. Consequently, these blocks will be subject to additional cleanup.

The effect of this is that certain blocks will be used much more often than will other blocks. These blocks will be cleaned up more often than will other blocks. In a relatively short period of time, a few blocks storing rapidly changing data will have been subjected to the normal lifetime of switching operations while the great majority of the blocks will have received very little such use. Since it is necessary that a number of blocks be constantly available for cleanup in order for the array to function, the failure of a very small number of blocks due to extensive use can cause the failure of the entire array.

In order to allow the operation of the present invention, a count of the number of times a block is erased is kept in the small block status portion 21 of the block apart from the other data. This portion 21 is illustrated in FIG. 2 at the bottom of the block 20.

Figure 3:
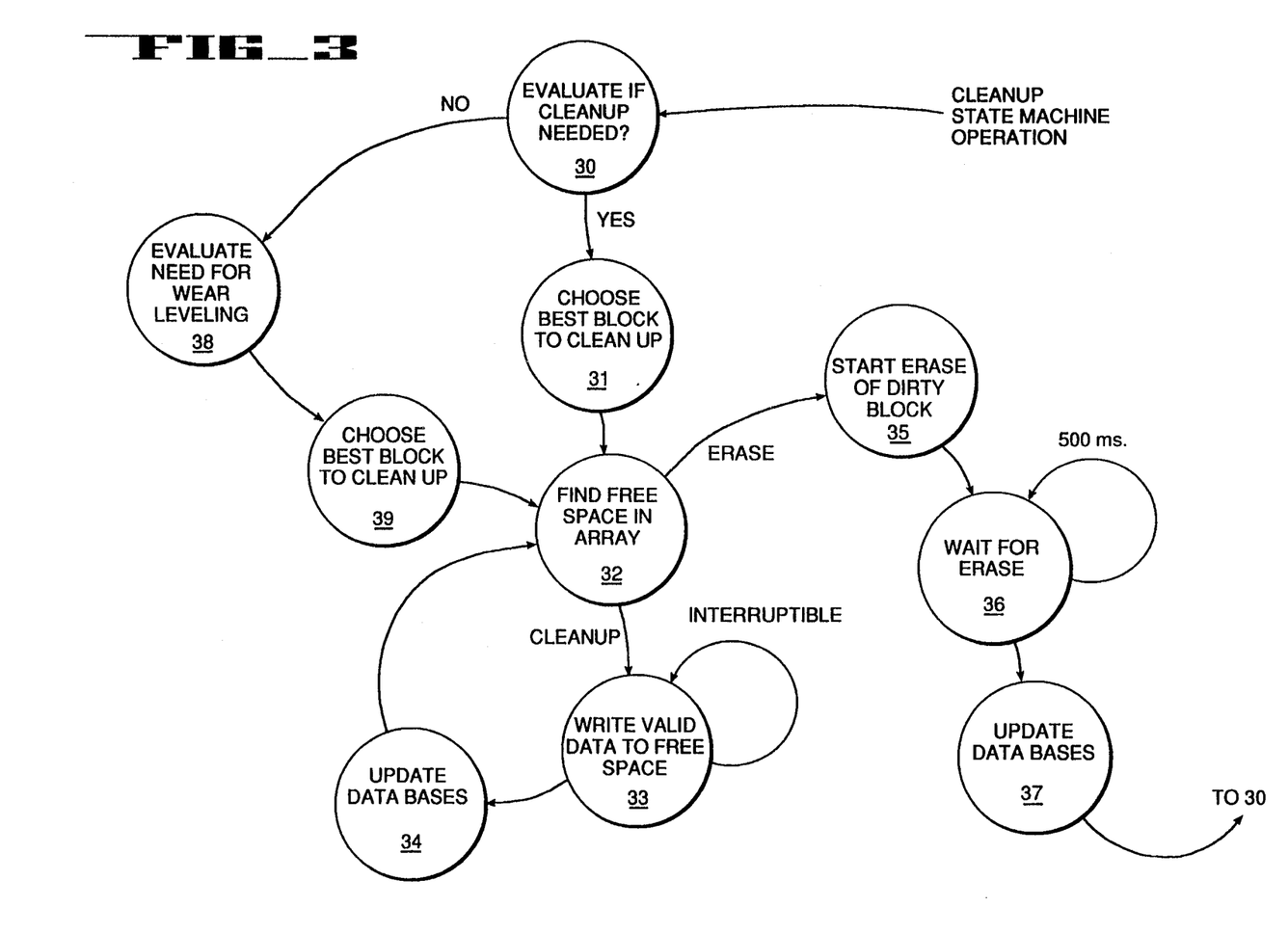
FIG. 3 is a flow chart illustrating a portion of a method in accordance with the present invention for equalizing the switching in a flash memory array.

In order to equalize switching use of the flash memory array, a process in accordance with the present invention is utilized. Typically, although not necessarily, the process is a software process carried out by the microprocessor of a controller 14 utilizing instructions stored in read only memory therewith. FIG. 3 is a diagram which illustrates a number of operations which the process of the present invention carries out in accomplishing the equalization of the number of switching operations between the blocks of the flash memory array. The diagram is arranged in the manner of a state diagram but is effectively identical to a flow chart for the operation. The operation is controlled by software stored in the read only memory of the read/write/erase control circuit 14. For the purpose of describing this invention, the read/write control circuit 14 may be considered to include in addition to the microprocessor and read only memory mentioned above, a command state machine and a write state machine which form an interface with the chips of the array for reading, writing, and erasing. This circuitry is described in extensive detail in U.S. patent application Ser. No. 07/655,643, entitled *Command State Machine*, Fandrich et al, filed Feb. 11, 1991, and assigned to the assignee of the present invention; and in U.S. patent application Ser. No. 07/654,375, entitled *Circuitry and Method for Programming and Erasing a Non-volatile Semiconductor Memory*, Kynett et al, filed Feb. 11, 1991, and assigned to the assignee of the present invention. In one embodiment, the command state machine and the write state machine are physically a portion of each of the chips 11.

The operation begins at a first step 30 where an evaluation takes place to decide whether a cleanup operation is necessary or not. Whether a cleanup is necessary is based on a question of whether there is block space available for writing or rewriting information. In one embodiment, if 80% or more of the total flash array (not including valid sectors which are in use) is dirty, then insufficient space is considered to be available; and it is necessary to perform a cleanup operation. The determination is made by keeping a small data base 12 of the amount of free space and a second small data base 13 of the amount of dirty space in the static RAM 16 associated with the array 10. The data base 13 may list the total dirty space and the amount of dirty space on each block while a second data base 12 in RAM 16 may list the total free space in the array and the amount of free space on each block. Whenever a sector is marked dirty, the size of the sector is added to the total of dirty space. Whenever a clean unused (free) sector is allocated to be written, its size is subtracted from the total amount of free space. Whenever a block is marked bad, all user data is copied out of the block. Then the amount of free space on the bad block is subtracted from the total amount of free space, and the amount of dirty space on the bad block is subtracted from the amount of dirty space. The data bases 12 and 13 are maintained by the processor of the read/write/erase control circuit 14 using software stored in its read only memory. By routinely maintaining the data bases, a ratio of dirty to dirty-plus-free space is always available as a valid measure of the percentage of the remaining array space which is dirty. If sufficient free space exists, cleanup is not necessary. If insufficient free space exists, then cleanup is necessary.

If cleanup is found to be necessary, the program moves to a step 31 in which the block best suited to cleanup is selected. The decision is made based on a set of criteria. The first of these criteria is which block is the dirtiest. The determination of the dirtiest block is made by comparing the amount of dirty space for each block held in the data base 13 against the dirty space of each other block held in the data base 13. The second of these criteria is which block has been through the lowest number of cleanup operations (cycles). The determination of which block has the lowest number of cleanup operations may be made by looking at the value stored in the fixed block structure area shown at the bottom of each block. As pointed out, this area contains a value designating how many cleanup operations the block has undergone. Other factors might also be included in the evaluation but for the purposes of this invention have no meaning and, consequently, are not discussed in this specification.

For each block, the value determined by reviewing the number of dirty sectors is weighted by a scaling factor (80% in one embodiment) while the number of cleanup operations is weighted (by finding the difference between the cleanup operations for the most cycled block and a particular block) by another scaling factor (20% in the same embodiment). The two results are totaled, and the block with the highest value is chosen to clean up. It will be seen that the dirtiest block value will overwhelmingly affect which block is chosen for cleanup; but, if two blocks are approximately equally dirty, the one having been cycled the least will be chosen. This has the effect of causing a block with less switching operations to be chosen for clean up. This has the ultimate effect of causing the block chosen to be written after the cleanup with data which is most likely to change most rapidly. The total effect is that the switching use placed on the blocks begins to be equalized.

Once the appropriate block to clean up has been chosen, the process moves to a step 32 at which available free sector space in other blocks is located. Once the space to store a valid sector has been located, the process moves to step 33 to write the valid data from the sector of the block being cleaned up to the available space. It should be noted that FIG. 3 illustrates the process of writing the valid data to the available space as iterating twenty times. This occurs because in one embodiment of the arrangement with which the invention is presently utilized, it is necessary that the various cleanup steps be interruptible so that operations desired by the host may be accomplished. Consequently, the various steps of the process have been broken into logical portions each of which may be accomplished in five hundred microseconds. In this way, the program illustrated may be interrupted by a host operation between any individual logical block of the process. The longer portions of the cleanup operations (such as the writing of valid sectors to available sector space on other blocks) may thus be interrupted each five hundred microseconds until the entire operation is finished.

Once the writing of valid data in a sector on the block being cleaned up to a sector on another block has been accomplished, the program moves to a step 34 in which the various data bases kept for the array are updated. This includes updating the sector translation tables (the headers) at the top of each of the blocks which has been affected by the write operations to invalidate the old headers, updating with the new physical address the lookup table 17 in the SRAM which is associated with the flash memory and allows the logical sectors to be placed anywhere in memory, and updating the data bases 12 and 13 kept in the SRAM listing the amount of dirty and free space.

After the data bases have been updated, the writing of sectors containing valid data continues, looping on itself until all of the valid sectors in the block being cleaned up have been moved to other blocks. When this is complete as will be indicated by the block containing no clean sectors in the header portion, the program moves to a step 35 at which the erase process for the block is started. The erase process typically takes between one and two seconds so the next step indicating a wait for erase indicates that the erase process is interruptible during that period at each five hundred microseconds in one embodiment.

Once the erase operation has been accomplished, the program moves to a step 36 at which data bases are again updated. These data bases include the count of switching operations which the cleaned up block has undergone (the cycle count), the amount of free and dirty space in memory, and other data not pertinent to the present invention.

After the data bases have been brought up to date, the program returns to the initial step 30 in which an evaluation of the need for a cleanup occurs. If a cleanup is still necessary to free additional storage occupied by dirty data, the entire process is repeated. This continues until cleanup is no longer necessary. When cleanup is no longer necessary, the program moves to a step 38 in which a determination is made whether switching operation equalization (termed "wear leveling") is necessary. It will be recognized that some substantial portion of this wear leveling has already been accomplished in the step at which the best block to cleanup was chosen in the main portion of the process. However, it has been found useful to utilize a second process when the processor of the flash memory is not otherwise occupied so that the total number of switching operations by the various blocks of the array may be brought closer together. To this end, an evaluation is made by comparing the number of switching operations each block has accomplished to determine whether any block has been cleaned up five hundred times less than the most cycled block of the array. If this has not occurred, the program exits the process. If this has occurred, then a wear leveling cleanup operation is begun.

The philosophy of initiating a cleanup at this point is that a block which has been cleaned up will receive new data which is most likely to be changed rapidly. Consequently, the program moves to a step 39 at which an evaluation is made of the best block to clean up based on wear leveling criteria. The same factors are considered, dirty sectors and number of switching operations which have taken place. However, the weighting applied to each value is varied so that the number of switching operations is given a much higher weight. For example, in one embodiment, the number of dirty sectors is given a weight of 20% while the number of switching operations (again measured by finding the difference between the cleanup operations for the most cycled block and a particular block) is given a weight of 80%. The numbers are totalled, and the block with the highest value is chosen to clean up. It will be seen that the number of switching operations will have an overwhelming effect on the block chosen for cleanup; the less switching operations, the more likely the block is to be chosen. However, when two blocks having somewhat the same number of switching operations exist, then the dirtiest block will have the highest total value and will be chosen. Thus, the general effect of the wear leveling cleanup is to cleanup the blocks having been cleaned up least in the past. Once the appropriate block has been chosen to implement the wear leveling cleanup operation, the program moves to the step 32 at which the cleanup begins. It then follows the same steps for cleanup as were described above.

Using the processes of the present invention described above, it has been found possible to provide continually available blocks of memory for use by the flash memory array while at the same time equalizing the amount of use among the blocks. This has the effect of substantially extending the life of such a memory array so that the projected life in normal operation is estimated at twenty-eight years, an expectancy far in excess of the typical computer component.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a process for cleaning up a flash EEPROM array separated into blocks of memory cells which blocks store data in sectors which contain valid and invalid data, and which blocks may be separately erased, and in which process for cleaning up all valid data is first written to other blocks of the array, and then the block is entirely erased, the improvement comprising:

the step of determining a block to clean up based on a comparison of the number of invalid sectors each block includes and the number of switching operations which each block has undergone.

2. In a process for cleaning up a flash EEPROM array as claimed in claim 1, the step of determining a block to clean up based on a comparison of the number of invalid sectors each block includes and the number of switching operations which each block has undergone, comprising:

comparing the number of invalid sectors on each block to the number of invalid sectors on all other blocks, assigning a value to each block derived from the comparison of the number of invalid sectors, comparing the number of switching operations each block has undergone to the number of switching operations each other block has undergone, assigning a value to each block derived from the comparison of the number of switching operations each other block has undergone, and totaling the values for each block to determine a block to be selected for cleanup.

3. In a process for cleaning up a flash EEPROM array as claimed in claim 2, the step of determining a block to clean up based on a comparison of the number of invalid sectors each block includes and the number of switching operations which each block has undergone, further comprising:

weighting the value derived by comparing the number of invalid sectors on each block to the number of invalid sectors on all other blocks, and weighting the value derived by comparing the number of switching operations each block has undergone to the number of switching operations each other block has undergone.

4. In a process for cleaning up a flash EEPROM array as claimed in claim 3, the steps of weighting the value derived by comparing the number of invalid sectors on each block to the number of invalid sectors on all other blocks weight, and weighting the value derived by comparing the number of switching operations each block has undergone to the number of switching operations each other block has undergone being chosen to favor the selection of a block having undergone a lesser number of switching operations.

5. In a process for cleaning up a flash EEPROM array as claimed in claim 3, the step of determining a block to clean up based on a comparison of the number of invalid sectors each block includes and the number of switching operations which each block has undergone, comprising:

the steps of weighting the value derived by comparing the number of invalid sectors on each block to the number of invalid sectors on all other blocks weight, and weighting the value derived by comparing the number of switching operations each block has undergone to the number of switching operations each other block has undergone being chosen to favor the selection of a block having a greater number of invalid sectors whenever a cleanup operation is required to provide space for additional writing to the flash EEPROM array, and the steps of weighting the value derived by comparing the number of invalid sectors on each block to the number of invalid sectors on all other blocks weight, and weighting the value derived by comparing the number of switching operations each block has undergone to the number of switching operations each other block has undergone being chosen to favor the selection of a block having undergone a lesser number of switching operations whenever a cleanup is not required but time for such a cleanup is available.

6. In a process for cleaning up a flash EEPROM array as claimed in claim 5, in which the steps of weighting the value derived by comparing the number of invalid sectors on each block to the number of invalid sectors on all other blocks weight, and weighting the value derived by comparing the number of switching operations each block has undergone to the number of switching operations each other block has undergone are chosen to favor the selection of a block having undergone a lesser number of switching operations whenever a cleanup is not required but time for such a cleanup is available, being trigger by a difference in switching operations of 500 or greater.

7. In a process for cleaning up a flash EEPROM array as claimed in claim 3, the step of determining a block to clean up based on a comparison of the number of invalid sectors each block includes and the number of switching operations which each block has undergone, comprising:

the steps of weighting the value derived by comparing the number of invalid sectors on each block to the number of invalid sectors on all other blocks weight with a value of 0.8, and weighting the value derived by comparing the number of switching operations each block has undergone to the number of switching operations each other block has undergone with a value of minus 0.2 whenever a cleanup operation is required to provide space for additional writing to the flash EEPROM array, and the steps of weighting the value derived by comparing the number of invalid sectors on each block to the number of invalid sectors on all other blocks weight with a value of 0.2, and weighting the value derived by comparing the number of switching operations each block has undergone to the number of switching operations each other block has undergone with a value of minus 0.8 whenever a cleanup is not required but time for such a cleanup is available.

8. In a process for cleaning up a flash EEPROM array as claimed in claim 3, the steps of weighting the value derived by comparing the number of invalid sectors on each block to the number of invalid sectors on all other blocks weight, and weighting the value derived by comparing the number of switching operations each block has undergone to the number of switching operations each other block has undergone being chosen to favor the selection of a block having a greater number of invalid sectors.

* * * * *